(12) United States Patent
Emerson et al.

(10) Patent No.: US 8,212,262 B2
(45) Date of Patent: Jul. 3, 2012

(54) TRANSPARENT LED CHIP

(75) Inventors: David T. Emerson, Chapel Hill, NC (US); Michael J. Bergmann, Chapel Hill, NC (US); Kevin W. Haberen, Cary, NC (US)

(73) Assignee: Cree, Inc., Durham, NC (US)

( * ) Notice: Subject to any disclaimer, the term of this patent is extended or adjusted under 35 U.S.C. 154(b) by 588 days.

(21) Appl. No.: 11/673,317

(22) Filed: Feb. 9, 2007

(65) Prior Publication Data

US 2008/0191224 A1    Aug. 14, 2008

(51) Int. Cl.
*H01L 33/00* (2010.01)

(52) U.S. Cl. ............ 257/79; 257/81; 257/E33.001

(58) Field of Classification Search ............. 257/79, 257/81, 98, E33.001
See application file for complete search history.

(56) References Cited

U.S. PATENT DOCUMENTS

| | | |
|---|---|---|
| 4,495,514 A | 1/1985 | Lawrence et al. |
| 5,718,760 A | 2/1998 | Carter et al. |
| 5,723,391 A | 3/1998 | Hunter et al. |
| 5,793,062 A | 8/1998 | Kish, Jr. |
| 6,066,861 A | 5/2000 | Hohn |
| 6,643,304 B1 | 11/2003 | Chen et al. |
| 6,646,292 B2 * | 11/2003 | Steigerwald et al. ......... 257/103 |
| 6,791,119 B2 | 9/2004 | Slater, Jr. et al. |
| 6,936,862 B1 | 8/2005 | Chang et al. |
| 7,061,026 B2 | 6/2006 | Huang |
| 7,297,988 B2 | 11/2007 | Chae |
| 7,345,324 B2 * | 3/2008 | Bour et al. ................. 257/101 |
| 7,462,876 B2 * | 12/2008 | Han et al. ................. 257/96 |
| 7,557,380 B2 * | 7/2009 | Haberern et al. ........... 257/81 |
| 7,687,813 B2 * | 3/2010 | Nakamura et al. ........ 257/95 |
| 7,781,789 B2 | 8/2010 | DenBaars et al. .......... 257/98 |
| 2001/0020703 A1 | 9/2001 | Gardner et al. |
| 2002/0063520 A1 | 5/2002 | Yu et al. |
| 2002/0125485 A1 | 9/2002 | Steigerwald et al. |
| 2004/0140765 A1 | 7/2004 | Takekuma |
| 2005/0023550 A1 | 2/2005 | Eliashevich et al. |
| 2005/0040755 A1 | 2/2005 | Song et al. |
| 2005/0151136 A1 | 7/2005 | Liu |
| 2005/0221519 A1 | 10/2005 | Leung |
| 2005/0236630 A1 | 10/2005 | Wang |
| 2006/0060874 A1 | 3/2006 | Edmond et al. |

(Continued)

FOREIGN PATENT DOCUMENTS

DE    196 29 920 A1    2/1997

(Continued)

OTHER PUBLICATIONS

Kaminska, "Transparent ZnO-based ohmic contact to p-GaN," Lawrence Berkeley National Laboratory, Apr. 9, 2002, 7 pages.

(Continued)

*Primary Examiner* — Roy K Potter
(74) *Attorney, Agent, or Firm* — Koppel, Patrick, Heybl & Philpott

(57) ABSTRACT

A light emitting diode is disclosed that includes a transparent substrate with an absorption coefficient less than 4 per centimeter, epitaxial layers having absorption coefficients of less than 500 per centimeter in the layers other than the active emission layers, an ohmic contact and metallization layer on at least one of the epitaxial layers, with the ohmic contact and metallization layer having a transmission of at least about 80 percent, and bond pads with reflectivity greater than at least about 70 percent.

45 Claims, 3 Drawing Sheets

U.S. PATENT DOCUMENTS

| | | |
|---|---|---|
| 2006/0131599 A1 | 6/2006 | Slater, Jr. et al. |
| 2006/0186418 A1 | 8/2006 | Edmond et al. |
| 2007/0023772 A1 | 2/2007 | Watanabe et al. |
| 2007/0037307 A1 | 2/2007 | Donofrio |

FOREIGN PATENT DOCUMENTS

| | | |
|---|---|---|
| DE | 10 2004 036 295 A1 | 3/2005 |
| DE | 10 2006 001 402 A1 | 10/2006 |
| WO | WO 98/12757 A1 | 3/1998 |

OTHER PUBLICATIONS

Official Communication from related German Patent Application No. 10 2008 007 835.2, dated Feb. 15, 2010 (translated and in German).

Official Communication for counterpart German Patent Application No. 10 2008 007 835.2 dated Dec. 1, 2009.

Notice of Rejection of counterpart Japanese Patent Application No. 2008-019894 issued Apr. 26, 2011.

* cited by examiner

Fig. 6
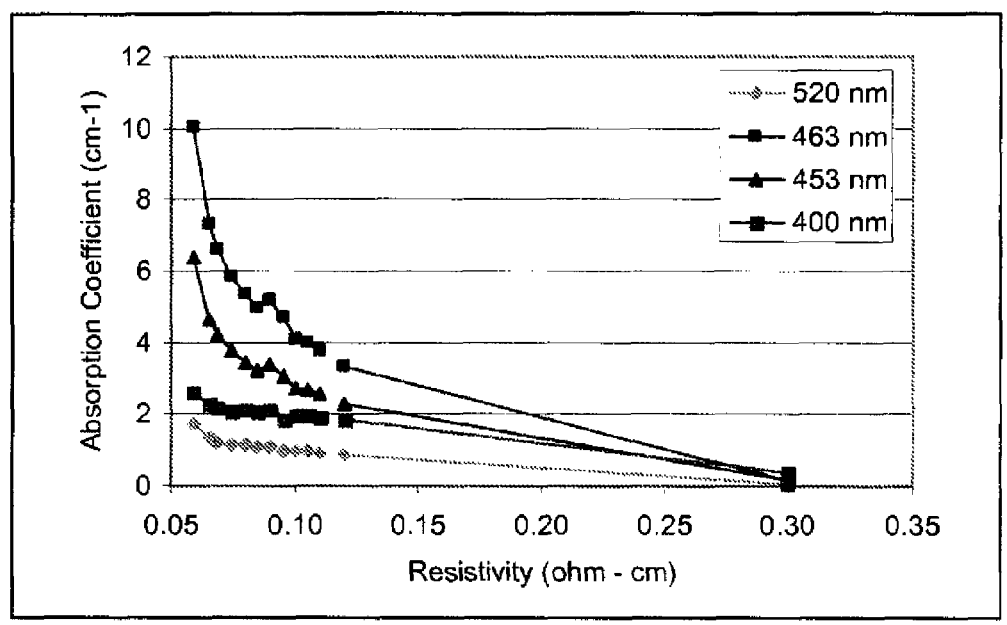
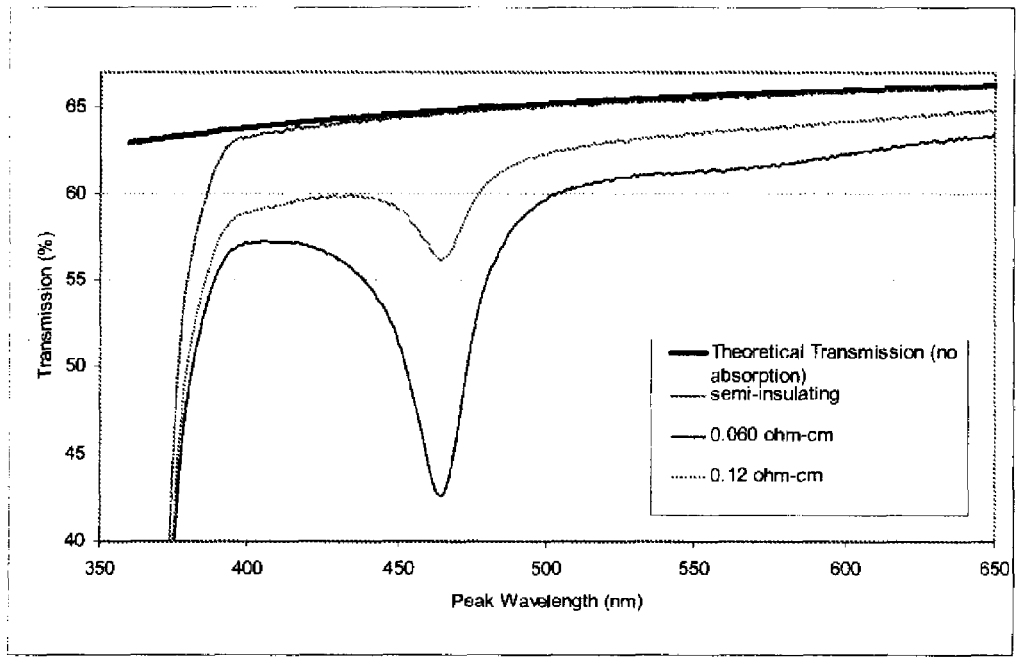
Fig. 7

TRANSPARENT LED CHIP

BACKGROUND

The present invention relates to light emitting diodes, and in particular relates to light emitting diodes (LEDs) that are used in conjunction with a phosphor that converts light from the LED to produce an output that is either partially or totally a combination of the frequencies emitted by the LED and those converted by the phosphor.

Light emitting diodes are a class of photonic devices in which the application of current across the device, and most fundamentally across p-n junction, generates recombination events between electrons and holes. In turn the events produce at least some energy in the form of emitted photons.

Because the recombination events are defined and constrained by the principles of quantum mechanics, the energy (and thus the photon) generated by the event depends upon the characteristics of the semiconductor material in which the event takes place. In this regard, the bandgap of the semiconductor material is the most fundamental characteristic with respect to the performance of light emitting diodes. Because the recombination events take place between the valence band and the conduction band of the semiconductor materials, they can never generate an amount of energy larger than the bandgap. Accordingly, materials with smaller bandgaps produce lower energy (and thus lower frequency) photons while materials with larger bandgaps can produce higher energy, higher frequency photons.

Light emitting diodes share a number of the favorable characteristics of other semiconductor devices. These include generally robust physical characteristics, long lifetime, high reliability, and, depending upon the particular materials, generally low cost.

Light emitting diodes, or at least the light emitting properties of semiconductors, have been recognized for decades. A 1907 publication (H. J. Round, Electrical World 49, 309) reported that current applied through silicon carbide produced an observed but unexplained emission of light. More widespread commercial use of LEDs began in the 1970s with indicator type use that incorporated lower frequency LEDs (typically red or yellow in color) formed from smaller bandgap materials such as gallium phosphide (GaP) and gallium arsenide phosphide (GaAsP).

In the 1990s, the development of the blue light emitting diode as a commercial rather than theoretical reality greatly increased the interest in LEDs for illumination purposes. In this regards, "indication" refers to a light source that is viewed directly as a self-luminous object (e.g. an indicator light on a piece of electronic equipment) while "illumination" refers to a source used to view other objects in the light reflected by those objects (e.g., room lighting or desk lamps). See, National Lighting Product Information Program, http://www.lrc.rpi.edu/programs/NLPIP/glossary.asp (December 2006).

Although light emitting diodes have become widely adapted for indicator purposes, their potential use for illumination includes applications such as indoor and outdoor lighting, backlighting (e.g. for displays), portable lighting (e.g., flashlights), industrial lighting, signaling, architectural and landscaping applications, and entertainment and advertising installations.

The availability of blue light emitting diodes correspondingly provides the opportunity for at least two techniques for producing white light. In one technique, blue LEDs are used in conjunction with red and green LEDs so the combination can form white light or—such as in a full-color display—any other combination of the three primary colors.

In a second technique, and one that has become commercially widely adopted, a blue light emitting diode is combined in a lamp with a yellow-emitting phosphor; i.e., a phosphor that absorbs the blue light emitted by the LED and converts and emits it as yellow light. The combination of blue and yellow light will produce a tone of white light that is useful for many illumination circumstances.

Although the terminology is used flexibly, the word "diode" (or "light emitting diode") is most properly applied to the basic semiconductor structure that includes the p-n junction. The term "lamp" most properly refers to a packaged device in which the diode is mounted on electrodes that can connect it to a circuit and within a polymer lens that both protects the diode from environmental exposure and helps increase and direct the light output. Nevertheless, the term "LED" is often used to refer to packaged diodes that might more correctly be referred to as lamps and vice versa. Generally speaking the meaning of the terms will be clear in context.

Because the blue frequencies represent the highest energy within the visible spectrum (with red frequencies being the lowest), they must be produced by relatively high-energy recombination events. This in turn requires that the semiconductor material have a relatively wide bandgap. Accordingly, candidate materials for blue light emitting diodes, and thus for white-emitting LED lamps, include silicon carbide (SiC), the Group III nitrides (e.g., GaN), and diamond.

Although the understanding and production of silicon carbide has increased greatly in the last 20 years, in quantum terms it is an indirect emitter. This means that when a recombination event takes place in SiC, a significant amount of the energy is emitted as a vibration rather than as a photon. Thus, although silicon carbide produces blue photons, it does so less efficiently than it would if it were a direct emitter.

Accordingly, most interest in blue light emitting diodes has focused upon the Group III nitride materials such as gallium nitride, aluminum gallium nitride (AlGaN), and indium gallium nitride (InGaN). The Group III nitrides have bandgaps sufficient to produce blue photons and are direct emitters, thus increasing their efficiency.

Illumination, however, tends to require higher quantities of light output than does indication. In this regard, the number of individual photons produced by a diode in any given amount of time depends upon the number of recombination events being generated in the diode, with the number of photons generally being less than the number of recombination events (i.e., not every event produces a photon). In turn, the number of recombination events depends upon the amount of current applied across the diode. Once again the number of recombination events will typically be less than the number of electrons injected across the junction. Thus, these electronic properties can reduce the external output of the diode.

Additionally, when photons are produced, they must also actually leave the diode and the lamp to be perceived by an observer. Although the majority of photons will leave the lamp without difficulty, a number of well-understood factors come into play that prevent the photons from leaving and that can thus reduce the external output of an LED lamp. These include internal reflection of a photon until it is re-absorbed rather than emitted. The index of refraction between the materials in the diode can also change the direction of an emitted photon and cause it to strike an object that absorbs it. The same results can occur for yellow photons that are emitted by the phosphor. In an LED lamp such "objects" can include the substrate, parts of the packaging, the metal contact layers, and any other material or element that prevents the photon from escaping the lamp.

To date, bulk crystal growth of large Group III nitride crystals remains difficult. Accordingly, in order to form the thin, high quality epitaxial layers that produce p-n junctions in LEDs, the Group III nitride materials must typically be grown on a substrate. When, as in some constructions, the substrate remains as part of the eventual light emitting lamp, it can provide one more opportunity to absorb photons emitted by the junction, thus reducing the external quantum efficiency of the overall diode.

In short summary, a number of factors can reduce the external light output of an LED lamp. Accordingly, a need exists for continued improvement in increasing the external output of such LED lamps.

SUMMARY

In one aspect, the invention is a light emitting diode that includes a transparent substrate with an absorption coefficient less than 4 per centimeter ($cm^{-1}$) in the blue region of the spectrum or less than 2 $cm^{-1}$ in the green region of the spectrum (for blue and green LEDs respectively), epitaxial layers having absorption coefficients of less than 500 $cm^{-1}$ in the layers other than the active emission layers; an ohmic contact layer on at least one of the epitaxial layers, with the ohmic contact and metallization layer having a transmission of at least about 80 percent, and the bond pad on the transparent ohmic contact layer having a reflectivity greater than at least about 70 percent.

In another aspect the invention is an LED lamp that includes a reflector, an LED chip mounted to the reflector with a transparent adhesive, the LED chip including a transparent epitaxial layer of n-type Group III nitride, a substantially transparent p-type layer on the n-type Group III nitride layer, a transparent current spreading layer on the p-type layer; an ohmic contact to the n-type-layer and an ohmic contact to the p-type layer, and a mirror adjacent each ohmic contact for redirecting light emitted from the p-n junction towards the p-n junction.

In yet another aspect the invention is a light emitting diode that includes respective p-type and n-type epitaxial layers of Group III nitride that form a p-n junction, a respective ohmic contact and bond pad to each of the n-type layer and the p-type layer, and a mirror in at least one of the respective bond pads, the mirror having a surface that reflects towards the p-n junction to encourage photons emitted by the diode that strike the bond pad to be reflected away from the bond pad rather than absorbed in the bond pad.

The foregoing and other objects and advantages of the invention and the manner in which the same are accomplished will become clearer based on the followed detailed description taken in conjunction with the accompanying drawings.

BRIEF DESCRIPTION OF THE DRAWINGS

FIG. 6 is a plot of silicon carbide (SiC) absorption as a function of wavelength and resistivity.

FIG. 7 is a plot of silicon carbide transmission as a function of wavelength and resistivity.

DETAILED DESCRIPTION

Figure 1:
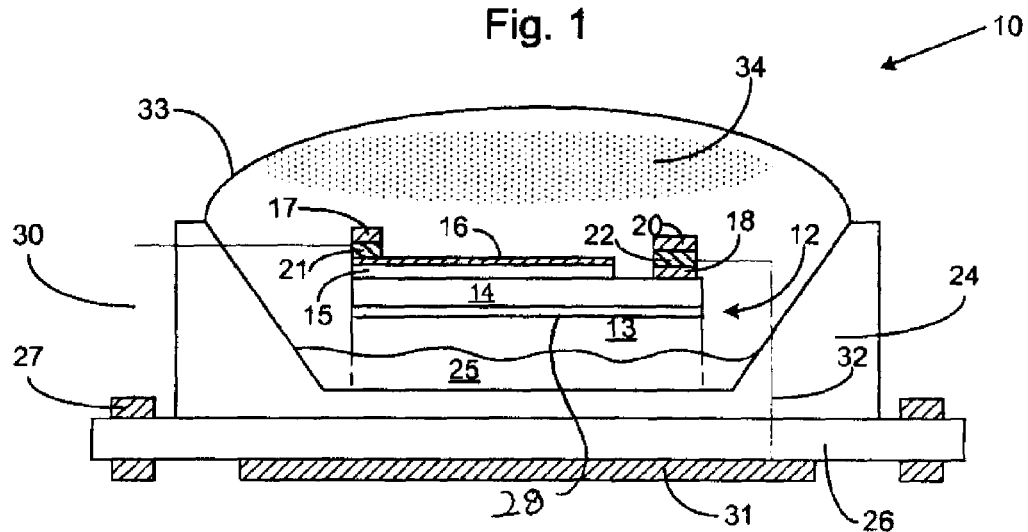
FIG. 1 is a cross sectional schematic view of a light emitting diode lamp according to the present invention.

In brief summary, the invention provides advantages in applications where the diode is used either on its own (for its desired frequency) or in conjunction with a phosphor to convert the light emitted by the diode. The invention solves the specific problems of reduced packaging efficiency when light emitted by the LED is absorbed and a similar loss in packaging efficiency when light converted by the phosphor is similarly absorbed.

The invention enhances the efficiency of the blue emission by reducing the absorption losses and thus produces a higher white conversion efficiency by reducing the absorption losses of both the blue light and the light emitted by the phosphor.

The invention thus provides advantages for light emitting diode lamps in general, as well as for applications where LED light is converted to another color. In addition, the invention is particularly useful for applications with difficult first pass light extraction or conversion such as sidelooker diode lamps.

The basic physics of light emitting diodes is well understood in the art and explained in sources that include, but are not limited to Sze, PHYSICS OF SEMICONDUCTOR DEVICES, 2d Edition (1981) and Sze, MODERN SEMICONDUCTOR DEVICE PHYSICS (1998). The practical applications of light emitting diodes are also well understood and are explained in helpful terms in a number of sources including LED LIGHTING SYSTEMS, NLPIP LIGHTING ANSWERS, Volume 7, Issue 3, May 2003, and Schubert, LIGHT EMITTING DIODES (Cambridge University Press, 2003).

The terms used herein to describe transparency are generally well understood in the art and in context. The term "absorption" describes the dissipation of light within a surface or medium caused by the conversion of the radiant energy to some other form of energy, usually heat (vibration) by interaction with such matter. The absorption is the difference between the total reflected and transmitted energy as compared to the incident energy. E.g., Lighting Design Glossary, http://www.schorsch.com/kbase/glossary/absorption.html (December 2006).

The ratio of the total absorbed radiant or luminous flux to the incident flux is called the "absorptance" (or in some cases the "absorption factor"). The standard unit of absorptance is percent or a fractional factor between zero and one. Id.

The "absorption coefficient" represents the fraction of light absorbed per unit distance in a medium. The standard unit of absorption coefficient is fraction per meter, or as used herein, per centimeter. Id.

The "scattering coefficient" is the fraction of light scattered per unit distance in a participating medium and is likewise expressed in terms of fraction per length; i.e. fraction per meter. Id.

The term "extinction coefficient" refers to the fraction of light lost per unit distance to both scattering and absorption in a participating media. The extinction coefficient is the sum of the absorption coefficient and the scattering coefficient. As with absorption coefficient, the standard unit of the extinction coefficient is fraction per meter. Id.

In the same manner, when transmission of light is described as a percentage, it refers to the difference between the intensity that strikes the object and the intensity of light that emerges after the original light has passed through the object. In this case, a transparent ohmic contact with a transmission of at least about 80 percent refers to a contact in which at least 80 percent of the intensity striking the contact will be transmitted from the contact. Stated in alternative fashion, no more than about 20 percent of the light striking the contact will be absorbed or reflected by the contact, again, expressed in terms of the original intensity of the incident light.

In general, the material properties defined above are functions of a variety of factors such as the wavelength of the light, the angle of incidence of the light on the surface of interest, and the purity of the material of interest. For example, a material may have a higher absorption in the blue region of the spectrum than in the green region of the spectrum. Similarly, a pure material may have a higher or lower absorption than a less pure material. FIGS. 6 and 7 show the absorption coefficient of light in SiC as a function of both resistivity and wavelength and the transmission of silicon carbide (SiC) for a fixed thickness, respectively. Although this example is shown for SiC, the general properties illustrated are also true for other materials such as unintentionally doped, n-type doped, and p-type doped aluminum gallium indium nitride.

FIG. 1 shows a light emitting diode according to the present invention in the context of an LED lamp. The lamp is broadly designated at 10, and the light emitting diode is broadly designated at 12. In a first embodiment, the diode 12 includes a transparent substrate 13 with an absorption coefficient less than 4 per centimeter (4 $cm^{-1}$) in the blue region of the spectrum or less than 2 $cm^{-1}$ in the green region of the spectrum. In exemplary embodiments, the absorption coefficient is less than 1 $cm^{-1}$ in both the green and blue regions of the spectrum. Silicon carbide is an exemplary material for the substrate, including both silicon carbide that has been doped in compensating fashion to be colorless (e.g., U.S. Pat. No. 5,718,760) or silicon carbide that is pure enough to be colorless (e.g., U.S. Pat. No. 5,723,391). The contents of both of these patents are incorporated entirely herein by reference.

FIGS. 6 and 7 are illustrative of the characteristics of silicon carbide substrates including those useful in the present invention. FIG. 6 illustrates that the absorption coefficient of silicon carbide is highest at low resistivity and decreases as the resistivity increases. In the green frequencies (i.e., the 520 nanometer line in FIG. 6) the absorption coefficient can be maintained at less than 2 $cm^{-1}$ by keeping the resistivity of the silicon carbide above 0.05 ohm-centimeters (Ω-cm). In the blue frequencies (i.e., the 453 and 463 nanometer lines in FIG. 6) the absorption coefficient can be maintained at less than 4 $cm^{-1}$ at a resistivity of about 0.07 or higher and can be reduced to about 2 $cm^{-1}$ at a resistivity of about 0.12 Ω-cm or higher.

Generally speaking, and with the recognition that the boundaries are arbitrary rather than exact, the blue frequencies generally fall between about 445 and 470 nanometers, the green frequencies between about 510 and 540 nanometers, and the relevant portions of the ultraviolet frequencies at between about 395 and 415 nanometers.

FIG. 7 illustrates the transmission characteristics of silicon carbide substrates. The darkest highest line illustrates the theoretical transmission of light at the wavelengths plotted on the x-axis and assuming no absorption. The lower three lines respectively indicate the transmission of semi-insulating silicon carbide, silicon carbide with a resistivity of 0.06 Ω-cm and silicon carbide with a resistivity of 0.12 Ω-cm. As the plot indicates the transmission capabilities of lower resistivity silicon carbide decreases significantly in the blue and green portions of the visible spectrum.

Accordingly, the information such in FIGS. 6 and 7 (which is generally available in the art) offers the skilled person a number of possibilities for combining a low absorption coefficient and a relatively high transmission for the silicon carbide substrate at a desired wavelength range.

Sapphire can also be produced with the required transparency parameters and can form an appropriate substrate for the present invention. Other transparent materials include zinc oxide, spinel, magnesium oxide, and the Group III nitrides, although as noted above, the Group III nitrides are less easily available in bulk crystals suitable for substrate purposes.

The diode 12 includes respective epitaxial layers 14 and 15 on the substrate 13. In the embodiment illustrated in FIG. 1, the first layer 14 on the substrate 13 is n-type and the second layer 15 is p-type. An ohmic contact and metallization layer 16 are on the p-type epitaxial layer 15 and have a transmission of at least about 80 percent. Another ohmic contact 18 is made to the n-type epitaxial layer 14. Because in a diode of this type, the contact to the n-type layer can typically be much smaller than the contact to the p-type layer (for reasons discussed below), the ohmic contact 18 need not be transparent, but optionally is transparent.

In exemplary embodiments, the epitaxial layers are formed from the Group III nitride materials system. The Group III nitride materials are generally designated by formulas such as $Al_xGa_{1-x}N$ and $In_xGa_{1-x}N$ with gallium nitride (GaN) and indium gallium nitride (InGaN) being used most frequently for the active layers. In particular, because the bandgap of indium gallium nitride can be controlled based upon the atomic fraction of indium, InGaN layers are often favored for active layer and emission purposes. The present invention includes Group III nitride diodes that emit in the blue portion of the spectrum as well as those that emit in the green and UV portions.

In particular, the Group III nitride epitaxial layers are likewise controlled to make sure that their absorption coefficient is (or remains) less than 500 per centimeter. As an exception, certain layers such as quantum wells will necessarily absorb, and thus such layers need not meet the 500 $cm^{-1}$ required. Any Group III nitride layers, however, through which light passes, rather than those in which light is generated, will meet the 500 $cm^{-1}$ absorption coefficient required.

In general, the growth of Group III nitride epitaxial layers on well-understood substrates such as silicon carbide or sapphire is well understood in the art with chemical vapor deposition (CVD) being the exemplary technique. The transparency of such layers can be increased by growing them at comparatively higher temperatures, minimizing the background impurities, and adjusting the ratio of the nitrogen source materials to the Group III source materials. The nature of epitaxial growth is such that the best combination of these factors may differ from facility to facility, but the necessary individual adjustments can be made by those of skill in this art without undue experimentation.

In other embodiments, individual epitaxial layers may have absorption coefficients as high as 1000 $cm^{-1}$, but the other epitaxial layers will have lower absorption coefficients sufficient to reduce the average coefficient per layer to less than 500 $cm^{-1}$.

It will also be understood that although the schematic diagrams herein are schematic and thus somewhat simplified in nature, the active portions of Group III nitride LEDs can include more complex structures such as quantum wells, multiple quantum wells, and superlattice structures. These structures are generally well understood in the art and in the references set forth above and will not be otherwise described in detail. Similarly, because the lattice constants of the Group III nitrides differ somewhat from the most typical substrate materials (particularly silicon carbide and sapphire), diodes according to the invention can also include one or more transition or buffer layers between such substrates and the Group III nitride epitaxial layers they support. One example is buffer layer 28 shown in FIG. 1. Such buffer layers are likewise well understood in the art and will not be otherwise described in detail.

The diode 12 further includes respective bond pads 17 and 20 that have a reflectivity towards the interior of the diode greater than at least about 70 percent, in some embodiments more than 80 percent, and in some embodiments more than 85 percent. More specifically, in exemplary embodiments the bond pads 17 and 20 include respective mirrors 21 and 22. Exemplary materials for the mirrors include metals such as aluminum (Al), silver (Ag), gold (Au), platinum (Pt), chromium (Cr) or palladium (Pd), potentially combined with other layers such as titanium (Ti) and tungsten (W) that help limit or prevent the precious metals (particularly silver) from migrating into other parts of the diode where its presence could adversely affect the diode's performance.

The ohmic contact portion of the contact and metallization layer 16 is typically selected from the group consisting of platinum, nickel, gold, zinc and combinations thereof. Alternatively, it may be selected from the group consisting of nickel oxide (NiO), zinc oxide (ZnO), and indium tin oxide (ITO), all of which provide the capability for a transparent conductive layer that transmits a high percentage of incident light. In exemplary embodiments, the ohmic contact layer 16 can have a transmittance of at least 90 percent and in some cases 95 percent. The ohmic contact layer 16 may also consist of a combination of the listed metals and transparent oxides.

The LED lamp 10 also includes a reflector 24 with the LED chip 12 being mounted to the reflector 24 by a transparent adhesive 25, an exemplary version of which is an epoxy. It will be understood, however, that any appropriate adhesive can be used provided it meets the mechanical requirements for maintaining the LED chip 12 on the reflector 24, does not otherwise interfere with the operation of the chip or the lamp 10, and does not degrade unreasonably rapidly under the heat and light output of the chip 12.

The reflector 24 is typically formed of a polymeric resin such as polyamide, polyester, or polycarbonate that includes a white pigment such as titanium dioxide ($TiO_2$).

The mirrors 21 and 22 redirect light emitted from the p-n junction towards that p-n junction rather than allowing the light to be absorbed by the bond pads 17 or 20. Exemplary metals for the mirrors include silver, aluminum, and chromium.

FIG. 1 also illustrates that the reflector 24 is typically positioned on a lamp substrate 26. In the illustrated embodiment, an external anode contact 27 is electrically connected to the bond pads 17 through an appropriate connection schematically illustrated as the wire 30. Similarly, the bond pad 20 is connected to a cathode contact 31 by the schematically illustrated wire 32.

For a number of reasons including environmental protection and light output, the lamp 10 typically includes an encapsulant 33 that also forms a lens for the diode 12 and the lamp 10. The encapsulant can be any appropriate material that does not otherwise interfere with the structure or function of the other elements of the diode 12 or of the lamp 10 and that likewise is appropriately physically rugged and stable for a reasonable lifetime with respect to both the heat and light produced by the diode chip 12. Polymer resins are the most common encapsulant materials, with glass being a potential alternative. Based upon the high frequency blue light emitted by a diode, the lens 33 is often formed of a polysiloxane resin, a type of polymer that is also colloquially referred to as silicone, and which is less affected by the blue frequencies than are some other polymers.

Perhaps most importantly in the context of a white light emitting lamp, the lens material 33 may include a dispersed, settled or otherwise positioned phosphor 34 for converting frequencies emitted by the diode into complementary frequencies that together produce white light.

In embodiments in which the Group III nitride epitaxial layers 14 and 15 are used to produce light in the blue portion of the visible spectrum, the phosphor 34 is selected to produce a complementary output that together with the blue output from the diode 12 will produce white light. An exemplary phosphor is cesium-doped YAG (yttrium aluminum garnet) in an average particle size of less than ten microns.

Figure 2:
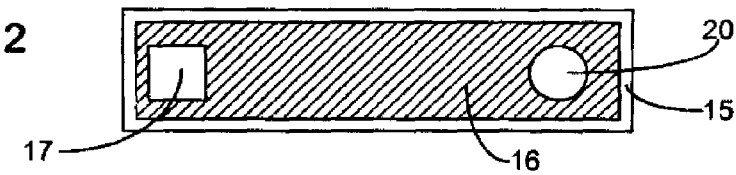
FIG. 2 is a top plan view of a light emitting diode according to the present invention.

FIG. 2 is a top plan view of the diode 12 slightly enlarged from the proportions illustrated in FIG. 1. FIG. 2 illustrates that because of the generally low conductivity of p-type Group III nitride layers the current spreading ohmic contact and metallization layer 16 generally extends over a large portion of the p-type epitaxial layer 15. Stated differently, a large electrode to the p-type layer helps drive an appropriate amount of current through a light emitting diode in the Group III nitride materials system. FIG. 2 also illustrates the respective positions of the bond pads 17 and 20.

Figure 3:
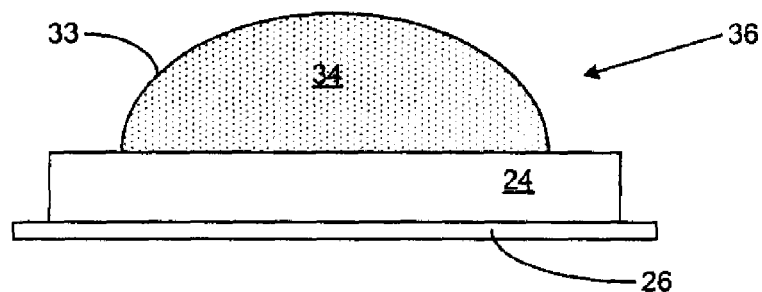
FIG. 3 is a side elevation view of a light emitting diode lamp according to the present invention.

FIG. 3 is a side elevational view of the diode according to the present invention again illustrating the reflector 24, the lamp substrate 25, the lens (encapsulant) 33 and the phosphor 34. In comparison to the schematic illustration of FIG. 1, FIG. 3 is somewhat more representative of the appearance of a commercial device. For packaging purposes, the anode and cathode contacts on the external portions of the lamp 36 are flush with the respective upper facing and lower facing portions of the lamp substrate 26.

Figure 4:
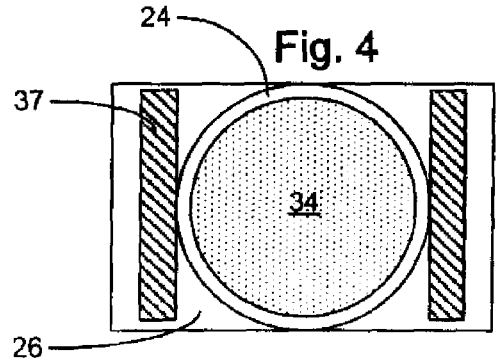
FIGS. 4 and 5 are respective top plan and bottom plan views of the diode of FIG. 3.
Figure 5:
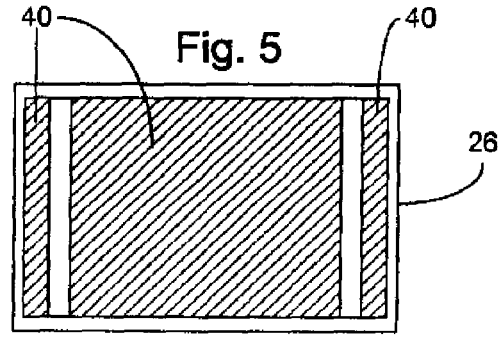

Accordingly, FIGS. 4 and 5 are respective top plan and bottom plan views of the lamp 36 to illustrate these external contacts. FIG. 4 illustrates the anode contacts on the top surface of the substrate 24 and FIG. 5 illustrates the cathode contacts 40 on the bottom surface of the substrate 26. In commercial embodiments, the cathode contacts 40 illustrated in FIG. 5 can be used in connection with complementing solder pads structures on printed circuit boards and similar electronic components.

Figure 8:
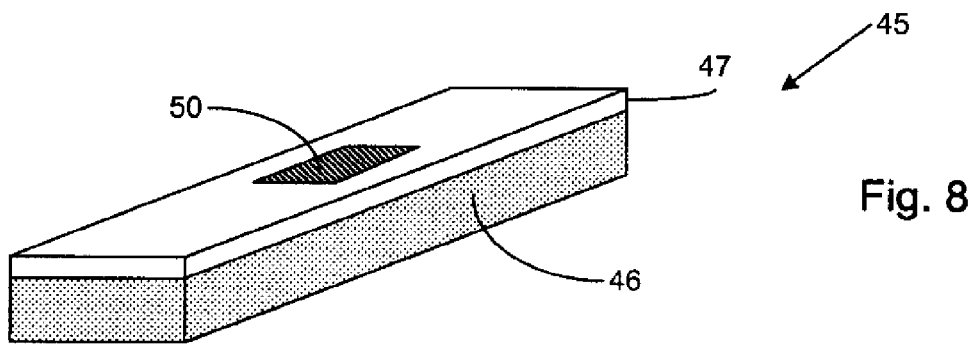
FIGS. 8, 9 and 10 are schematic perspective views of diodes according to the present invention.
Figure 9:
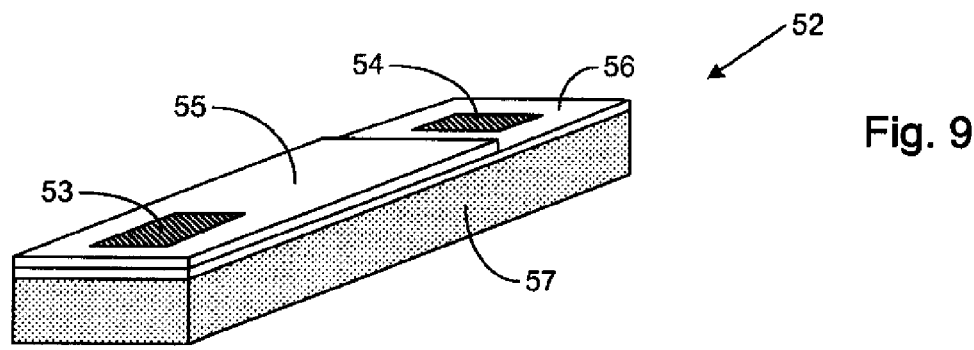
Figure 10:
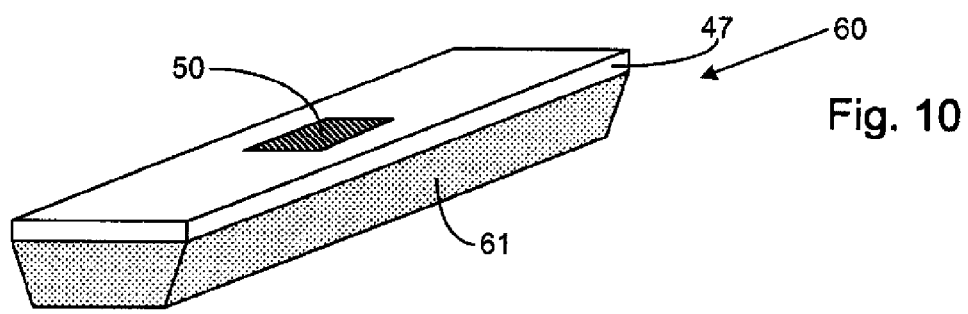

FIGS. 8, 9 and 10 are generalized perspective views of diode variations with which the present invention can be incorporated. As is the case in certain commercial embodiments, the diode takes the general shape of a solid rectangle. In FIG. 8 the diode is broadly designated at 45. The transparent substrate is illustrated at 46 and the epitaxial layers together at 47. The transparent ohmic contact 50 is made to the top of the diode 45 and a similar ohmic contact (not shown in FIG. 8) is on the bottom of the conductive substrate 46.

FIG. 9 illustrates a diode 52 in which respective ohmic contacts 53 and 54 (and any associated bond pad metals, potentially including mirrors) are both positioned on the top of the diode 52 on each of the respective epitaxial layers 55 and 56. The transparent substrate is illustrated at 57.

FIG. 10 illustrates a diode 60 generally similar to that illustrated in FIG. 8 with a top ohmic contact again designated at 50 and the epitaxial layers illustrated schematically together at 47. FIG. 10 illustrates, however, that the substrate 61 can be shaped to increase light extraction. A number of patents and published applications describe such shaping or potentially the use of lenticular surfaces. These include (but are not limited to) commonly assigned and co-pending applications Publication No. 20060060874 and Ser. No. 11/461,018, filed Jul. 31, 2006 for "Method of Forming 3D Features for Improved Light Extraction," as well as the more randomly generated features described in commonly assigned and co-pending application Ser. No. 11/343,180 filed Jan. 30, 2006 and published as No. 20060186418. The contents of each of these applications are incorporated entirely herein by reference.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode comprising:
a transparent substrate with an absorption coefficient less than 4 per centimeter;
epitaxial layers having absorption coefficients of less than 500 per centimeter in any layers other than the active emission layers;
a Group III nitride buffer layer between said epitaxial layers and said transparent substrate, said buffer layer having an absorption coefficient of less than 1000 per centimeter; and
an ohmic contact on at least one of said epitaxial layers, said ohmic contact having a transmission of at least about 80 percent.

2. A light emitting diode according to claim 1 further comprising bond pads with reflectivity greater than at least about 70 percent.

3. A light emitting diode according to claim 1 wherein said transparent substrate has an absorption coefficient less than 1 per centimeter.

4. A light emitting diode according to claim 1 further comprising a metallization layer wherein said ohmic contact and metallization layer has a transmission of at least about 95 percent.

5. A light emitting diode according to claim 2 wherein said bond pads have a reflectivity greater than at least about 90 percent.

6. A light emitting diode lamp comprising:
a reflector;
a light emitting diode on said reflector, said light emitting diode comprising:
a transparent substrate with an absorption coefficient less than 4 per centimeter;
epitaxial layers having absorption coefficients of less than 500 per centimeter in the layers other than the active emission layers;
a Group III nitride buffer layer between said epitaxial layer and said transparent substrate, said buffer layer having an absorption coefficient of less than 1000 per centimeter; and
an ohmic contact on at least one of said epitaxial layers, said ohmic contact having a transmission of at least about 80 percent;
a lens encapsulating said diode on said reflector; and
a phosphor distributed in said lens.

7. A lamp according to claim 6 wherein said lens comprises a polysiloxane resin.

8. A light emitting diode according to claim 1 wherein said epitaxial layers are selected from the Group III nitride material system.

9. A light emitting diode according to claim 8 wherein said epitaxial layers emit in the blue portion of the visible spectrum.

10. A light emitting diode according to claim 8 wherein said epitaxial layers emit in the green portion of the visible spectrum.

11. A lamp according to claim 6 wherein said a phosphor converts frequencies in the blue portion of the visible spectrum into frequencies in the yellow portion of the visible spectrum.

12. A lamp according to claim 6 wherein said phosphor comprises cesium-doped YAG.

13. A light emitting diode, comprising:
a transparent substrate with an absorption coefficient less than 4 per centimeter wherein said transparent substrate comprises silicon carbide;
epitaxial layers having absorption coefficients of less than 500 per centimeter in the layers other than the active emission layers;
a Group III nitride buffer layer between said epitaxial layer and said transparent substrate, said buffer layer having an absorption coefficient of less than 1000 per centimeter; and
an ohmic contact on at least one of said epitaxial layers, said ohmic contact having a transmission of at least about 80 percent.

14. A light emitting diode according to claim 13 comprising a compensated silicon carbide substrate.

15. A light emitting diode according to claim 13 wherein any dopant atoms present in said silicon carbide substrate are present in amounts less than the amounts that would raise the absorption coefficient above 0.5 $cm^{-1}$ in the green region of the spectrum, above 1 $cm^{-1}$ in the UV region of the spectrum, and above 2 $cm^{-1}$ in the blue region of the spectrum.

16. A light emitting diode according to claim 1 further comprising a metallization layer on at least one of said epitaxial layers wherein:
said ohmic contact is selected from the group consisting of platinum, nickel, gold, zinc, and combinations thereof; and
said metallization layer is selected from the group consisting of nickel oxide, zinc oxide and indium tin oxide.

17. A light emitting diode according to claim 1 further comprising a metallization layer on at least one of said epitaxial layers wherein said ohmic contact and metallization layer includes a metal oxide selected from the group consisting of nickel oxide, zinc oxide, and indium tin oxide.

18. A light emitting diode, comprising:
a transparent substrate with an absorption coefficient less than 4 per centimeter;
epitaxial layers having absorption coefficients of less than 500 per centimeter in the layers other than the active emission layers;
a Group III nitride buffer layer between said epitaxial layer and said transparent substrate, said buffer layer having an absorption coefficient of less than 1000 per centimeter;
an ohmic contact layer on at least one of said epitaxial layers, said ohmic contact having a transmission of at least about 80 percent; and
bond pads with reflectivity greater than at least about 70 wherein at least one of said bond pads includes a mirror selected from the group consisting of aluminum, silver, and chromium.

19. A light emitting diode according to claim 18 comprising an n-type conductive silicon carbide substrate and an ohmic contact to said substrate.

20. A light emitting diode according to claim 1 comprising:
a p-type epitaxial layer;
an ohmic contact to said p-type epitaxial layer;
an n-type epitaxial layer; and
an ohmic contact to said n-type epitaxial layer.

21. An LED lamp comprising:
a reflector;
an LED chip mounted to said reflector with a transparent adhesive;
said LED chip including a transparent epitaxial layer of n-type Group III nitride;
a substantially transparent p-type layer on said n-type Group III nitride layer;
a transparent current spreading layer on said p-type layer;
an ohmic contact to said n-type-layer and an ohmic contact to said p-type layer; and
a mirror adjacent each said ohmic contact for redirecting emitted light towards said p-type and n-type layers.

22. An LED lamp according to claim 21 wherein said LED chip includes a transparent substrate formed of insulating silicon carbide.

23. An LED lamp according to claim 21 comprising a respective bond pad to each of said ohmic contacts with one of said mirrors in each said bond pad.

24. An LED lamp according to claim 21 wherein said transparent adhesive comprises an epoxy.

25. An LED lamp according to claim 21 further comprising electrodes from said LED chip through said polymer package for mounting said lamp to a circuit or another device.

26. An LED lamp according to claim 21 further comprising an encapsulant over said LED chip in said polymer package.

27. An LED chip according to claim 26 wherein said encapsulant comprises a polysiloxane resin.

28. An LED lamp according to claim 21 further comprising a phosphor distributed in said encapsulant.

29. An LED lamp according to claim 28 wherein said phosphor converts light in the blue frequencies of the visible spectrum into light in the yellow frequencies of the visible spectrum.

30. An LED lamp according to claim 28 wherein said phosphor comprises YAG.

31. A light emitting diode comprising:
respective p-type and n-type epitaxial layers of Group III nitride that form a p-n junction;
a respective ohmic contact and bond pad to each of said n-type layer and said p-type layer, wherein said ohmic contact comprises nickel oxide, zinc oxide or indium tin oxide; and
a mirror in at least one of said respective bond pads, said mirror having a surface that reflects towards the p-type and n-type epitaxial layers to encourage photons emitted by the diode that strike the bond pad to be reflected away from the bond pad rather than absorbed in the bond pad.

32. A light emitting diode according to claim 31 comprising a mirror in each said bond pad.

33. A light emitting diode according to claim 31 wherein each said mirror is at least 70 percent reflective.

34. A light emitting diode according to claim 31 further comprising a substrate with an absorption coefficient of less than 0.5 cm$^{-1}$ in the green region of the spectrum, less than 1 cm$^{-1}$ in the UV region of the spectrum, and less than 2 cm$^{-1}$ in the blue region of the spectrum.

35. A light emitting diode according to claim 34 comprising a silicon carbide substrate.

36. A light emitting diode according to claim 31 further comprising a transparent metal layer on said ohmic contact.

37. A light emitting diode according to claim 36 wherein said transparent metal layer is selected from the group consisting of nickel oxide, zinc oxide and indium tin oxide.

38. A light emitting diode according to claim 36 wherein said transparent metal layer has a transmission of at least 80 percent.

39. A light emitting diode comprising:
an active portion that emits in the visible portion of the electromagnetic spectrum;
a substrate;
epitaxial layers other than said active portion and having absorption coefficients of less than 500 cm$^{-1}$ in the predominant wavelengths emitted by said active portion; and
an ohmic contact layer on at least one of said epitaxial layers, said ohmic contact and layer having a transmission of at least about 90 percent in the predominant wavelengths emitted by said active portion;
a bond pad associated with at least one of said epitaxial layers with reflectivity greater than at least about 85 percent in the predominant wavelengths emitted by said active portion;
an encapsulant covering said diode; and
a phosphor in said encapsulant;
said substrate having an absorption coefficient less than 2 per centimeter in the peak wavelengths emitted by said active portion and the predominant wavelengths emitted by said phosphor.

40. A light emitting diode comprising:
a transparent substrate with an absorption coefficient less than four per centimeter;
a plurality of epitaxial layers in which no single epitaxial layer has an absorption coefficient greater than 1000 per centimeter in the wavelengths emitted by said diode and with the average of all of said epitaxial layers being less than 500 per centimeter in the wavelengths emitted by said diode;
an ohmic contact layer to at least one of said epitaxial layers, said ohmic contact layer having a transmission of at least about 80 percent in the wavelengths emitted by said diode; and
a bond pad with a reflectivity greater then at least about 70 percent in the wavelengths emitted by said diode.

41. A light emitting diode according to claim 40 wherein said epitaxial layers are selected from the Group III nitride material system.

42. A light emitting diode according to claim 41 wherein said epitaxial layers emit in frequencies selected from the group consisting of UV frequencies and frequencies in the blue and green portions of the visible spectrum.

43. A light evening diode according to claim 40 further comprising:
an encapsulant covering said diode; and
a phosphor in said encapsulant;
wherein said substrate has an absorption coefficient less than 4 per centimeter in the predominant wavelengths emitted by said phosphor;
said epitaxial layers have absorption coefficients less than 500 per centimeter in the predominant wavelengths emitted by said phosphor; and
said ohmic contact has a transmission of at least 80 percent in the predominant wavelengths emitted by said phosphor; and
said bond pad has a reflectivity greater than at least about 70 percent in the predominant wavelengths emitted by said phosphor.

44. A light emitting diode according to claim 40 wherein said ohmic contact includes a metal oxide selected from the group consisting of nickel oxide, zinc oxide, and indium tin oxide.

45. A light emitting diode according to claim 40 wherein said bond pad includes a mirror selected from the group consisting of aluminum, silver, and chromium.

* * * * *

UNITED STATES PATENT AND TRADEMARK OFFICE
CERTIFICATE OF CORRECTION

PATENT NO.       : 8,212,262 B2                                    Page 1 of 1
APPLICATION NO.  : 11/673317
DATED            : July 3, 2012
INVENTOR(S)      : Emerson et al.

It is certified that error appears in the above-identified patent and that said Letters Patent is hereby corrected as shown below:

Col. 10, line 14, please add the word --percent-- after "70"

Signed and Sealed this
Sixteenth Day of October, 2012

David J. Kappos
*Director of the United States Patent and Trademark Office*